United States Patent
Naffziger et al.

[11] Patent Number: 5,900,766
[45] Date of Patent: May 4, 1999

[54] COUPLING CHARGE COMPENSATION DEVICE FOR VLSI CIRCUITS

[75] Inventors: Samuel D Naffziger, Ft Collins; Jeffry D Yetter, Loveland, both of Colo.

[73] Assignee: Hewlett-Packard Company, Palo Alto, Calif.

[21] Appl. No.: 08/893,434

[22] Filed: Jul. 11, 1997

[51] Int. Cl.$^6$ .................................................. H03K 17/04
[52] U.S. Cl. ........................................ 327/382; 327/387
[58] Field of Search .................................... 327/379, 382, 327/384, 387, 389, 391, 427, 434, 437; 326/21, 26, 27

[56] References Cited

U.S. PATENT DOCUMENTS

| | | | |
|---|---|---|---|
| 5,091,661 | 2/1992 | Chiang | 326/39 |
| 5,774,405 | 6/1998 | Tomishima | 365/226 |

OTHER PUBLICATIONS

Patent Abstracts of Japan, vol. 014, No. 268 (E–0939), Jun. 11, 1990 and JP 02 084817 A (NEC Corp), Mar. 26, 1990, abstract; figure 2.

*Primary Examiner*—Tuan T. Lam
*Attorney, Agent, or Firm*—Alexander J. Neudeck

[57] ABSTRACT

A circuit for reducing capacitive coupling between a culprit and a victim signal line is provided which comprises two inverters, a n-channel FET connected as a capacitor, and a p-channel FET connected as a capacitor. The input of both inverters are connected to the culprit line. The first inverter is designed to respond to high-to-low transition on the culprit line more rapidly than a low-to-high transition. The output of the first inverter is connected to the drain and source of the n-channel FET. The gate of the n-channel FET is connected to the victim line. The second inverter is designed to respond to low-to-high transition on the culprit line more rapidly than a high-to-low transition. The output of the second inverter is connected to the drain and source of the p-channel FET. The gate of the p-channel FET is connected to the victim line.

18 Claims, 2 Drawing Sheets

COUPLING CHARGE COMPENSATION DEVICE FOR VLSI CIRCUITS

FIELD OF THE INVENTION

This invention relates to electronic circuits. In particular this invention relates to integrated electronic circuits for reducing the effects of charge coupling between wires on a VLSI chip.

BACKGROUND OF THE INVENTION

On a VLSI integrated circuit, such as a microprocessor, some signal lines may be routed adjacent to each other over relatively large distances. This may be necessary because the signals have a common source and destination; are part of a large multi-bit bus, or were coincidentally routed adjacent to each other by an automated router. Unfortunately, this arrangement causes problems that may lead to unreliable, or incorrect, functioning of the integrated circuit.

When at least one of the signal lines switches (the culprit) while at least one of the other signals is attempting to remain at its previous value (the victim), the capacitance between the switching line (or lines) will cause the victim line to "glitch" as charge is capacitively transferred between the culprit line(s) and the victim line. This "glitch" can cause failures when, for example, it causes the victim line to rise above a gate threshold voltage from ground, turning on an n-channel FET (field effect transistor) whose gate is connected to the victim line.

One solution to this problem is to increase the spacing between signal lines. This reduces the amount of charge coupled from the culprit(s) to the victim by decreasing the capacitance between them. However, this is undesirable because it increases the cost of the integrated circuit by reducing the overall density of the VLSI integrated circuit.

Another solution is to add a "ballast" capacitor connected between the victim signal and a power supply. This reduces the amount of "glitch" voltage change that occurs by increasing the overall capacitance of the victim line. However, this is undesirable because the "ballast" capacitor burdens the victim line with extra charge that must be removed from the victim line when the victim line switches even though some of that charge is not used to prevent "glitching."

Thus, the need has arisen for an improved way of reducing "glitch" due to capacitive coupling between signal lines on an integrated circuit. The improved "glitch" reduction scheme should not require increased line spacing so that the overall density of the integrated circuit (and hence, the cost) is not significantly impacted. Furthermore, such an improved scheme should minimize the amount of capacitance added to the victim line so that the victim line may still switch a rapidly as possible thus maximizing the speed of the circuit.

SUMMARY OF THE INVENTION

This and other needs are met by the present invention that actively transfers charge onto the victim line as the culprit line is switching. It uses an inverter and a capacitor to dump charge onto the victim line. The input to the inverter is connected to the culprit line to sense when the culprit line is switching. In one embodiment, the capacitor is constructed from the gate of a FET.

In another embodiment, a first inverter is constructed to respond very rapidly to a falling edge on the culprit line. The output of this first inverter is connected to the drain and source of a n-channel FET. The gate of the n-channel FET is connected to the victim line. A second inverter is constructed to respond very rapidly to a rising edge on the culprit line. The output of this second inverter is connected to the drain and source of a p-channel FET. The gate of the p-channel FET is connected to the victim line.

DETAILED DESCRIPTION

Figure 1:
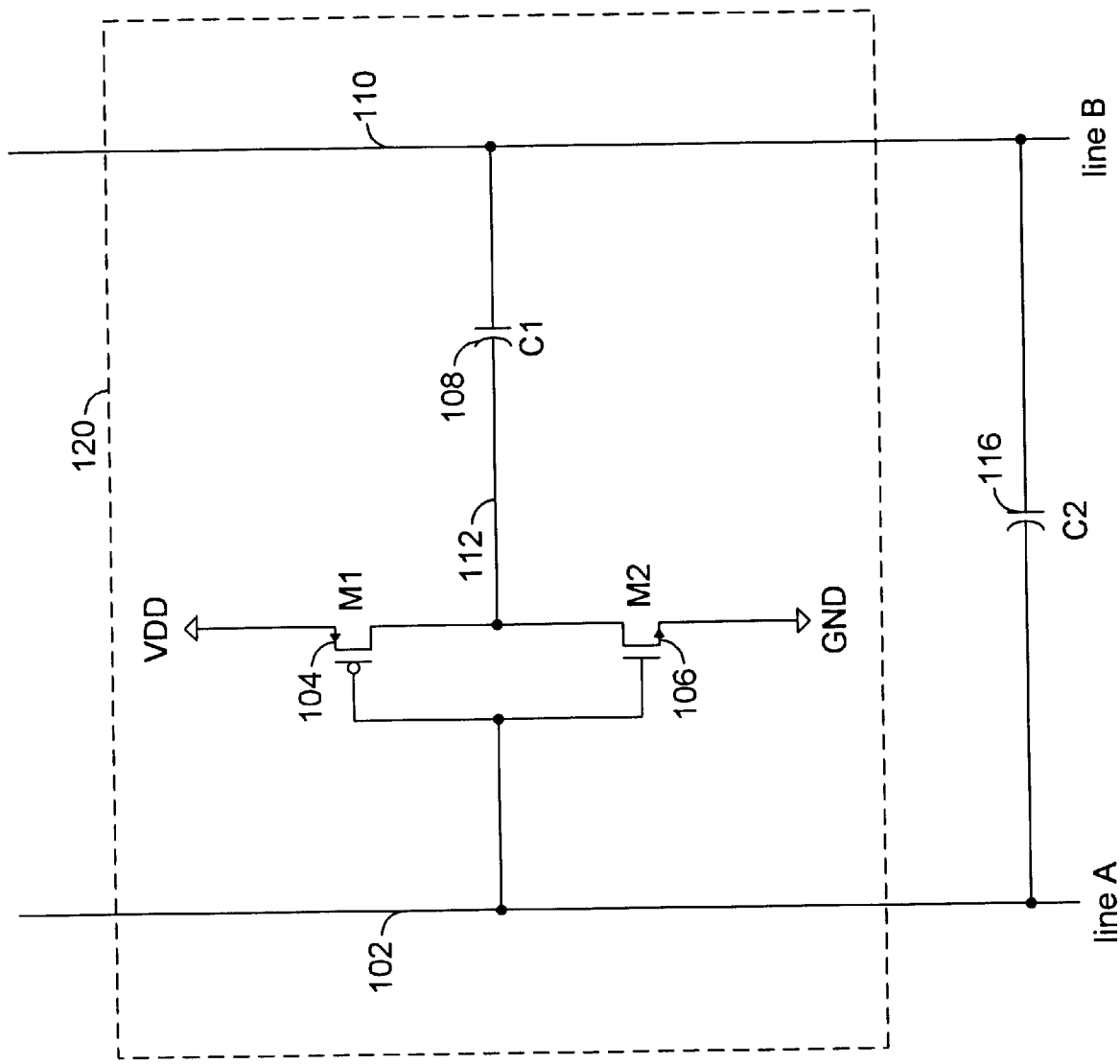
FIG. 1 is a schematic illustration showing a charge compensation circuit and the parasitic capacitance between the culprit and the victim line.

FIG. 1 shows the charge compensation circuit and the parasitic capacitance between the culprit line 102 and the victim line 110. The parasitic capacitance between the culprit and the victim is shown as capacitor C2 116. The charge compensation circuit is shown inside box 120. P-channel field effect transistor (a.k.a. PFET) M1 104 and n-channel field effect transistor (a.k.a. NFET) M2 106 form a CMOS inverter that has the culprit line 102 as an input. The source of M1 is connected to the positive supply rail VDD. The gate of M1 is connected to the culprit line 102. The drain of M1 is connected to intermediate node 112. The source of M2 is connected to the negative supply rail GND. The gate of M2 is connected to the culprit line 102. The drain of M2 is connected to intermediate node 112. Capacitor C1 108 is connected between intermediate node 112 and the victim line 110.

To illustrate the operation of the circuit, assume that both the culprit and the victim line are discharged to a voltage at or near GND. Now assume that the culprit line starts to transition from this low state to a high state. As the voltage on the victim line rises, current will flow from the culprit line through parasitic capacitance C2 to the victim line. This current causes the victim line to begin to accumulate charge, causing the voltage on the victim line to rise. However, as the culprit line rises, it also causes transistor M1 to turn off, and M2 to turn on. This causes intermediate node 112 to transition from a high state to a low state. As intermediate node 112 transitions, current will flow from the victim line, through capacitor C1, through transistor M2, to GND. This current serves to remove some, if not all of the charge that flowed onto the victim line through parasitic capacitance C2. The exact amount of charge that is removed from the victim line depends on the size of C1. Because the exact amount of charge that is placed on the victim line depends on C2, the size picked for C1 depends on C2, the location of the signal drivers for the culprit and victim lines, and the location of the charge compensation circuit. A typical range of sizes for C1 may be between 10% to 50% of C2. In one embodiment, C1 is chosen to be about 20% of C2 and the charge compensation circuit is located near the receiver connected to the victim line. The size picked for C1 may also be optimized by using an analog circuit simulator. The best known analog circuit simulator is SPICE, which was developed by the University of California at Berkeley and is available commercially from several companies.

Figure 2:
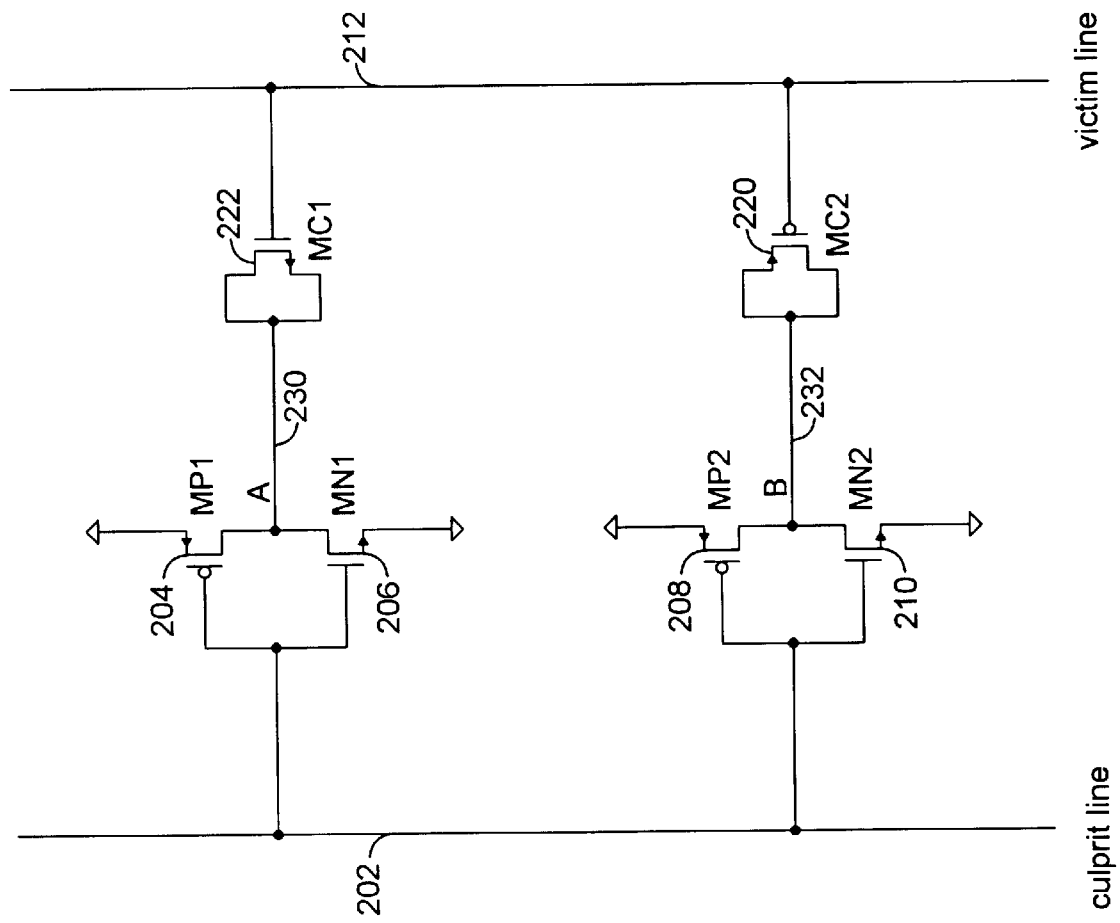
FIG. 2 is a schematic illustration of a charge compensation circuit that uses an NFET as a capacitor to optimize charge compensation of falling edges on the culprit line and a PFET as a capacitor to optimize charge compensation of rising edges on the culprit line.

FIG. 2 shows a charge compensation circuit that uses a NFET as a capacitor to optimize charge compensation of falling edges on the culprit line and a PFET as a capacitor to optimize charge compensation of rising edges on the culprit line. The culprit line 202 is connected to a first CMOS inverter comprised of PFET MP1, 204, and NFET MN1, 206. The output of this first inverter is connected to intermediate node A, 230. PFET MP1 is much wider than NFET MN1 so that the output node of this first inverter, A, will switch very rapidly from a low to a high level when culprit line 202 starts changing from a high level to a low level. For example, the width of MP1 might be four times the width of MN1. Intermediate node A is connected to the source and drain of an NFET, MC1, 222, that is being used as a capacitor. The gate of MC1 is connected to victim line 212. Before a falling edge on the culprit can occur, the culprit line must be at a high level. Therefore, intermediate node A must be at a low level. The most important situation is to prevent a low going "glitch" on a victim line which is already at a high level. Choosing MC1 to be an NFET and connecting the gate of MC1 to the victim line maximizes the capacitance of MC1 because MC1 will have formed a channel because the gate of MC1 will be at a high level and the source and drain will be at a low level. (i.e. MC1 will be "on".) Furthermore, the parasitic capacitances associated with the drain and source diodes of MC1 are only presented to the intermediate node A and do not burden the victim line.

The culprit line 202 is also connected to a second CMOS inverter comprised of PFET MP2, 208, and NFET MN2, 210. The output of this second inverter is connected to intermediate node B, 232. NFET MN2 is much wider than PFET MP2 so that the output node of this second inverter, B, will switch very rapidly from a high to a low level when culprit line 202 starts changing from a low level to a high level. For example, the width of MN2 might be three times the width of MP2. Intermediate node B is connected to the source and drain of an PFET, MC2, 220, that is being used as a capacitor. The gate of MC2 is connected to victim line 212. MC2 is chosen to be a PFET for similar reasons given above for choosing MC1 to be an NFET. One embodiment has each charge dump capacitor MC1 and MC2 being approximately 5% to 25% of the interline capacitance between the culprit and the victim. As before, the actual sizes of MC1 and MC2 may be optimized using an analog circuit simulator.

When the victim line switches, it will couple charge onto the culprit. Hence the roles as victim/culprit line can be reversed. Accordingly, one embodiment duplicates the circuits of FIGS. 1 and 2 and connects the additional circuits to prevent coupling from the victim lines, 110 and 212, to the culprit lines 102 and 202.

It is to be understood that the claimed invention is not to be limited by the preferred embodiments but encompasses other modifications and alterations within the scope and spirit of the inventive concept. For example, the invention has been described in terms of compensating for coupling charge between static signals. However, it could easily be used on signal lines carrying dynamic or pre-charge pull-down signals. The described embodiments are to be considered as illustrative and not restrictive, the scope of the invention being indicated by the claims rather than by the foregoing description.

We claim:

1. A charge compensation apparatus, comprising:
   a culprit line and a victim line, wherein there is a parasitic capacitance between the culprit line and the victim line;
   a first charge dumping capacitor, said first charge dumping capacitor being constructed from a n-channel field effect transistor (NFET), the NFET having a first drain and a first source and a first gate, and wherein the first gate is connected to the victim line;
   a first inverter, having a first input and a first output, the first input being coupled to the culprit line, the first output being connected to the first drain and the first source;
   a second charge dumping capacitor, said second charge dumping capacitor being constructed from a p-channel field effect transistor (PFET), the PFET having a second drain and a second source and a second gate, and wherein the second gate is connected to the victim line; and
   a second inverter, having a second input and a second output, the second input being coupled to the culprit line, the second output being connected to the second drain and the second source.

2. The apparatus of claim 1 wherein the parasitic capacitance has the effect of causing charge coupling of a first direction between the culprit line and the victim line when the culprit line transitions between a first voltage level and a second voltage level, and wherein the parasitic capacitance has the effect of causing charge coupling of a second direction between the culprit line and the victim line when the culprit line transitions between the second voltage level and the first voltage level, wherein the first direction is the opposite of the second direction, and wherein the first voltage level is higher than the second voltage level, and wherein the first inverter switches the first output faster in response to the culprit line transitions between the first voltage level and the second voltage level than the first inverter switches the first output in response to the culprit line transition between the second voltage level and the first voltage level.

3. The apparatus of claim 1 wherein the second inverter switches the second output faster in response to the culprit line transitions between the second voltage level and the first voltage level than the second inverter switches the second output in response to the culprit line transitions between the first voltage level and the second voltage level.

4. The apparatus of claim 3 wherein the first inverter switches the first output faster in response to the culprit line transitions between the first voltage level and the second voltage level than the second inverter switches the second output in response to the culprit line transition between the first voltage level and the second voltage level.

5. A charge compensation apparatus, comprising:
   a culprit line and a victim line, wherein there is a parasitic capacitance between the culprit line and the victim line;
   transition detecting means for determining when the culprit line transitions from a first voltage level to a second voltage level, wherein said second voltage level is greater than said first voltage level; and
   charge dumping means, responsive to the transition detecting means, for moving a charge off of the victim line.

6. The apparatus of claim 5, wherein the charge dumping means is a capacitor.

7. The apparatus of claim 6, wherein the transition detecting means is a CMOS inverter.

8. A charge compensation apparatus, comprising:
   a culprit line and a victim line, wherein there is a parasitic capacitance between the culprit line and the victim line;
   transition detecting means for determining when the culprit line transitions from a first voltage level to a second voltage level, wherein said second voltage level is greater than said first voltage level;

a charge dumping means having a first terminal and a second terminal, the first terminal being connected to the victim line; and wherein said transition detecting means comprises switching means, for connecting the second terminal to a power supply that is approximately the first voltage level.

9. The apparatus of claim 8, wherein the charge dumping means is a capacitor.

10. The apparatus of claim 9, wherein the switching means is comprised of a field effect transistor.

11. A charge compensation apparatus, comprising:

a culprit line and a victim line, wherein there is a parasitic capacitance between the culprit line and the victim line, said parasitic capacitance having the effect of causing charge coupling between the culprit line and the victim line when the culprit line transitions between a first voltage level and a second voltage level, wherein said second voltage level is greater than said first voltage level; and an inverter having an input and an output, the input being coupled to the culprit line and the output being connected to a first terminal of a charge dumping capacitor, wherein a second terminal of the charge dumping capacitor is connected to the victim line, and whereby the inverter switches the output in response to the transition of the culprit line from the first voltage level to the second voltage level thereby reducing the effect of charge coupling between the culprit line and the victim line by moving a charge on the charge dumping capacitor off of the victim line.

12. A charge compensation apparatus, comprising:

a culprit line and a victim line, wherein there is a parasitic capacitance between the culprit line and the victim line;

transition detecting means for determining when the culprit line transitions from a first voltage level to a second voltage level, wherein said second voltage level is less than said first voltage level; and charge dumping means, responsive to the transition detecting means, for moving a charge onto the victim line.

13. The apparatus of claim 12, wherein the charge dumping means is a capacitor.

14. The apparatus of claim 13, wherein the transition detecting means is a CMOS inverter.

15. A charge compensation apparatus, comprising:

a culprit line and a victim line, wherein there is a parasitic capacitance between the culprit line and the victim line;

transition detecting means for determining when the culprit line transitions from a first voltage level to a second voltage level, wherein said second voltage level is less than said first voltage level;

a charge dumping means having a first terminal and a second terminal, the first terminal being connected to the victim line; and wherein said transition detecting means comprises switching means, for connecting the second terminal to a power supply that is approximately the first voltage level.

16. The apparatus of claim 15, wherein the charge dumping means is a capacitor.

17. The apparatus of claim 16, wherein the switching means is comprised of a field effect transistor.

18. A charge compensation apparatus, comprising:

a culprit line and a victim line, wherein there is a parasitic capacitance between the culprit line and the victim line, said parasitic capacitance having the effect of causing charge coupling between the culprit line and the victim line when the culprit line transitions between a first voltage level and a second voltage level, wherein said second voltage level is less than said first voltage level; and an inverter having an input and an output, the input being coupled to the culprit line and the output being connected to a first terminal of a charge dumping capacitor, wherein a second terminal of the charge dumping capacitor is connected to the victim line, and whereby the inverter switches the output in response to the transition of the culprit line from the first voltage level to the second voltage level thereby reducing the effect of charge coupling between the culprit line and the victim line by moving a charge on the charge dumping capacitor onto the victim line.

* * * * *